(12) United States Patent
Mochizuki

(10) Patent No.: US 7,260,791 B2
(45) Date of Patent: Aug. 21, 2007

(54) INTEGRATED CIRCUIT DESIGNING SYSTEM, METHOD AND PROGRAM

(75) Inventor: Tsuyoshi Mochizuki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 296 days.

(21) Appl. No.: 10/972,412

(22) Filed: Oct. 26, 2004

(65) Prior Publication Data

US 2005/0283744 A1     Dec. 22, 2005

(30) Foreign Application Priority Data

Jun. 18, 2004   (JP) .............................. 2004-180941

(51) Int. Cl.
*G06F 17/50* (2006.01)
(52) U.S. Cl. .............................. 716/2; 716/4
(58) Field of Classification Search ...................... None
See application file for complete search history.

(56) References Cited

U.S. PATENT DOCUMENTS

| | | | | | |
|---|---|---|---|---|---|
| 4,602,339 | A | * | 7/1986 | Aihara et al. | 716/19 |
| 4,816,999 | A | * | 3/1989 | Berman et al. | 716/2 |
| 4,960,724 | A | * | 10/1990 | Watanabe et al. | 716/2 |
| 5,210,699 | A | * | 5/1993 | Harrington | 716/5 |
| 5,463,563 | A | * | 10/1995 | Bair et al. | 716/11 |
| 5,475,605 | A | * | 12/1995 | Lin | 716/6 |
| 5,515,526 | A | * | 5/1996 | Okuno | 716/2 |
| 6,237,132 | B1 | * | 5/2001 | Dean et al. | 716/18 |

FOREIGN PATENT DOCUMENTS

| JP | 8-87532 | 4/1996 |
|---|---|---|
| JP | 2000-353185 | 12/2000 |

* cited by examiner

*Primary Examiner*—Leigh M. Garbowski
(74) *Attorney, Agent, or Firm*—Staas & Halsey LLP

(57) ABSTRACT

When a simulation model generation unit converts logic on the gate level into a basic primitive which can be executed by a simulator to generate a simulation model, for the basic primitives a degeneracy processing unit determines and deletes a gate which can be deleted and which will not affect the delay stage count. The degeneracy processing unit is provided with a constant gate degeneracy unit which puts a plurality of constant gates together, a buffer degeneracy unit which deletes fan-out-free buffers and an identical fan-in gate degeneracy unit which puts identical fan-in gates together.

22 Claims, 26 Drawing Sheets

FIG. 7A 62-1

| LIBRARY ID | 1 |
|---|---|
| LIBRARY NAME | LIB 1 |
| FAN-IN NUMBER | 0 |
| FAN-OUT NUMBER | 1 |

64-1

| LIBRARY ID | 1 |
|---|---|
| LIBRARY NAME | LIB 2 |
| FAN-IN NUMBER | 0 |
| FAN-OUT NUMBER | 1 |

FIG. 7B 62-2

| LIBRARY ID | 1 |
|---|---|
| LIBRARY NAME | LIB 1 |
| FAN-IN NUMBER | 0 |
| FAN-OUT NUMBER | 1 |

64-2

| LIBRARY ID | 1 |
|---|---|
| LIBRARY NAME | LIB 2 |
| FAN-IN NUMBER | 0 |
| FAN-OUT NUMBER | 1 |

FIG. 8A

| 66-1 | INSTANCE ID | 1 |
| --- | --- | --- |
| | IDENTICAL INSTANCE REPRESENTATIVE ID | 1 |
| | INSTANCE NAME | INST 1 |

| 68-1 | INSTANCE ID | 2 |
| --- | --- | --- |
| | IDENTICAL INSTANCE REPRESENTATIVE ID | (2) |
| | INSTANCE NAME | INST 2 |

| 70-1 | INSTANCE ID | 3 |
| --- | --- | --- |
| | IDENTICAL INSTANCE REPRESENTATIVE ID | 3 |
| | INSTANCE NAME | FF 1 |

| 72-1 | INSTANCE ID | 4 |
| --- | --- | --- |
| | IDENTICAL INSTANCE REPRESENTATIVE ID | 4 |
| | INSTANCE NAME | FF 2 |

FIG. 8B

| 66-2 | INSTANCE ID | 1 |
| --- | --- | --- |
| | IDENTICAL INSTANCE REPRESENTATIVE ID | 1 |
| | INSTANCE NAME | INST 1 |

| 68-2 | INSTANCE ID | 2 |
| --- | --- | --- |
| | IDENTICAL INSTANCE REPRESENTATIVE ID | (1) |
| | INSTANCE NAME | INST 2 |

| 70-2 | INSTANCE ID | 3 |
| --- | --- | --- |
| | IDENTICAL INSTANCE REPRESENTATIVE ID | 3 |
| | INSTANCE NAME | FF 1 |

| 72-2 | INSTANCE ID | 4 |
| --- | --- | --- |
| | IDENTICAL INSTANCE REPRESENTATIVE ID | 4 |
| | INSTANCE NAME | FF 2 |

FIG. 9A 74-1:

| NET ID | 1 | 2 |
|---|---|---|
| IDENTICAL POTENTIAL NET REPRESENTATIVE ID | 1 | (2) |
| NET NAME | N1 | N2 |

| NET ID | 1 | 2 |
|---|---|---|
| IDENTICAL POTENTIAL NET REPRESENTATIVE ID | 1 | (1) |
| NET NAME | N1 | N2 |

| LIBRARY ID | 1 |
|---|---|
| INSTANCE ID | 1 |
| OUTPUT NET POTENTIAL ID | 1 |

88-1

| LIBRARY ID | 2 |
|---|---|
| INSTANCE ID | 2 |
| INPUT NET POTENTIAL ID | 1 |
| OUTPUT NET POTENTIAL ID | 2 |

90-1

| LIBRARY ID | 2 |
|---|---|
| INSTANCE ID | 3 |
| INPUT NET POTENTIAL ID | 2 |
| OUTPUT NET POTENTIAL ID | 0 |

FIG. 12B 86-2

| LIBRARY ID | 1 |
|---|---|
| INSTANCE ID | 1 |
| OUTPUT NET POTENTIAL ID | 1 |

DELETED

DELETED

FIG. 13A 92-1

| LIBRARY ID | 1 |
|---|---|
| LIBRARY NAME | LIB 1 |
| FAN-IN NUMBER | 0 |
| FAN-OUT NUMBER | 1 |

94-1

| LIBRARY ID | 2 |
|---|---|
| LIBRARY NAME | LIB 2 |
| FAN-IN NUMBER | 1 |
| FAN-OUT NUMBER | 1 |

FIG. 13B 92-2

| LIBRARY ID | 1 |
|---|---|
| LIBRARY NAME | LIB 1 |
| FAN-IN NUMBER | 0 |
| FAN-OUT NUMBER | 1 |

94-2

| LIBRARY ID | 2 |
|---|---|
| LIBRARY NAME | LIB 2 |
| FAN-IN NUMBER | 0 |
| FAN-OUT NUMBER | 1 |

| INSTANCE ID | 1 |
|---|---|
| IDENTICAL INSTANCE REPRESENTATIVE ID | 1 |
| INSTANCE NAME | INST 0 |

98-1

| INSTANCE ID | 2 |
|---|---|
| IDENTICAL INSTANCE REPRESENTATIVE ID | (2) |
| INSTANCE NAME | INST 1 |

100-1

| INSTANCE ID | 3 |
|---|---|
| IDENTICAL INSTANCE REPRESENTATIVE ID | (3) |
| INSTANCE NAME | INST 2 |

| INSTANCE ID | 1 |
|---|---|
| IDENTICAL INSTANCE REPRESENTATIVE ID | 1 |
| INSTANCE NAME | INST 0 |

98-2

| INSTANCE ID | 2 |
|---|---|
| IDENTICAL INSTANCE REPRESENTATIVE ID | (1) |
| INSTANCE NAME | INST 1 |

100-2

| INSTANCE ID | 3 |
|---|---|
| IDENTICAL INSTANCE REPRESENTATIVE ID | (1) |
| INSTANCE NAME | INST 1 |

FIG. 15A

| NET ID | 1 |
|---|---|
| IDENTICAL POTENTIAL NET REPRESENTATIVE ID | 1 |
| NET NAME | N1 |

102-1

| NET ID | 2 |
|---|---|
| IDENTICAL POTENTIAL NET REPRESENTATIVE ID | (2) |
| NET NAME | N2 |

| NET ID | 1 |
|---|---|
| IDENTICAL POTENTIAL NET REPRESENTATIVE ID | 1 |
| NET NAME | N1 |

102-2

| NET ID | 2 |
|---|---|
| IDENTICAL POTENTIAL NET REPRESENTATIVE ID | (1) |
| NET NAME | N2 |

104-2

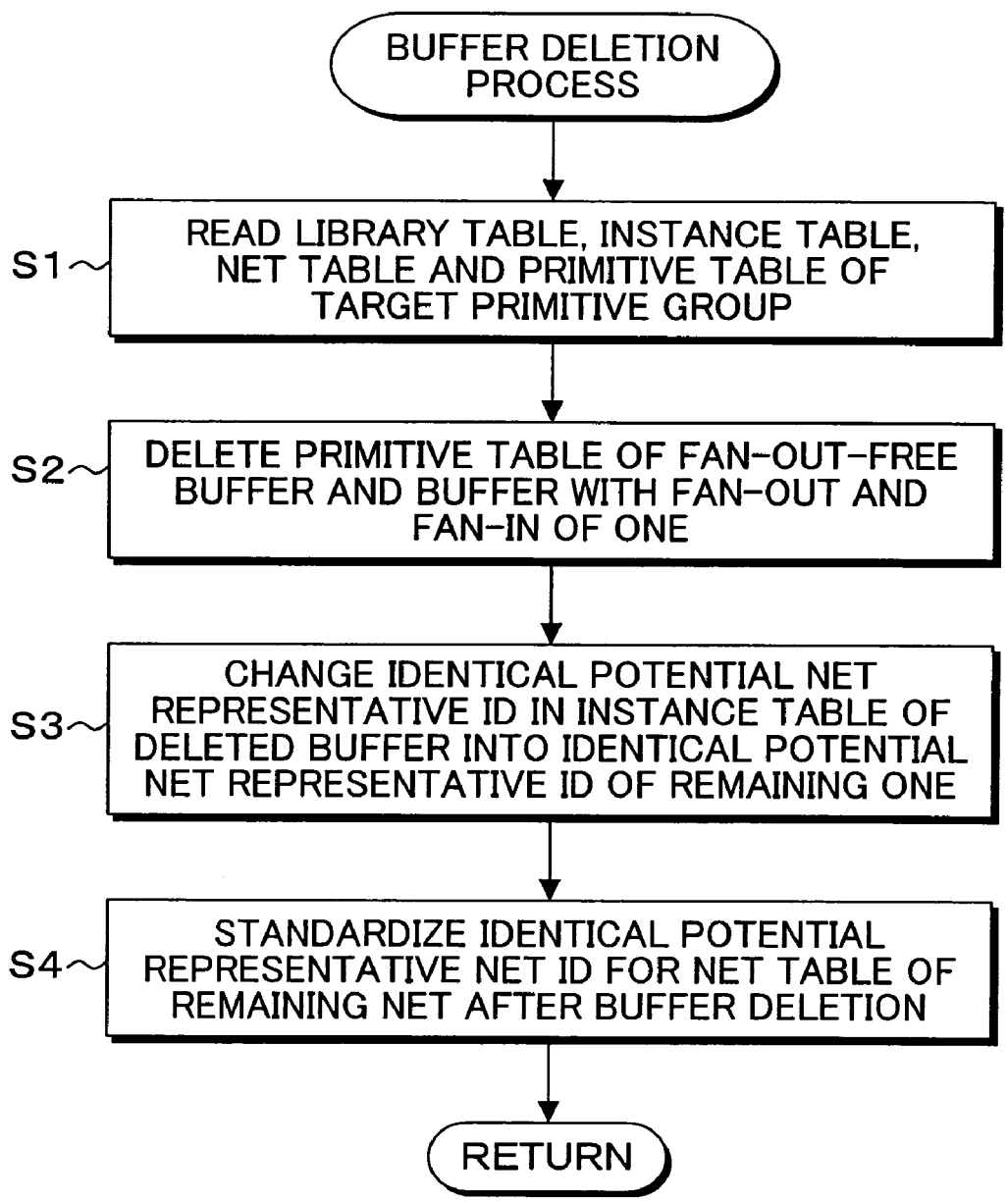

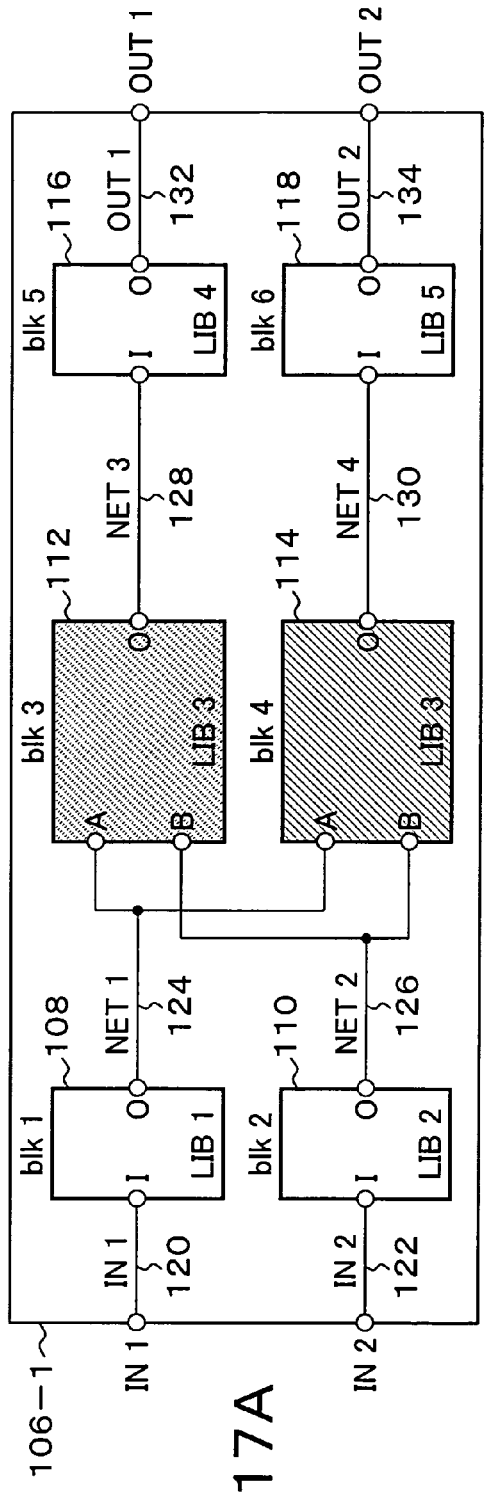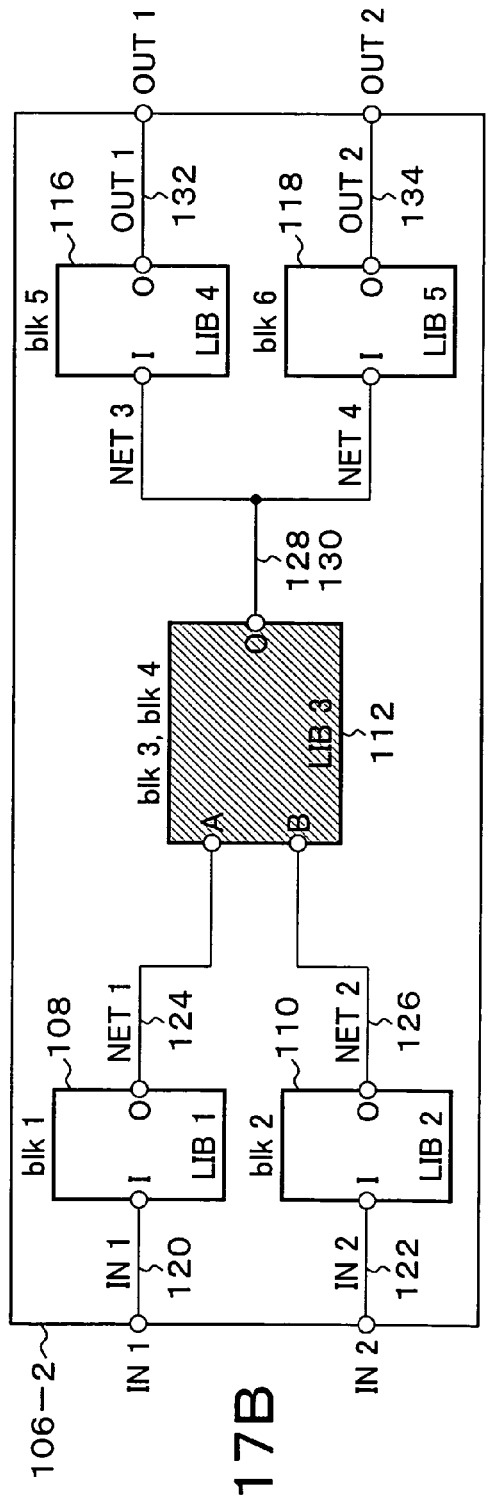
FIG. 17A
FIG. 17B

FIG. 18A 136-1

| LIBRARY ID | 1 |
|---|---|
| INSTANCE ID | 1 |
| INPUT NET POTENTIAL ID | 1 |
| OUTPUT NET POTENTIAL ID | 3 |

138-1

| LIBRARY ID | 2 |
|---|---|
| INSTANCE ID | 2 |
| INPUT NET POTENTIAL ID | 2 |
| OUTPUT NET POTENTIAL ID | 4 |

140-1

| LIBRARY ID | 3 |
|---|---|
| INSTANCE ID | 3 |
| INPUT NET POTENTIAL ID | 3 |
| OUTPUT NET POTENTIAL ID | 4 |
| OUTPUT NET POTENTIAL ID | 5 |

FIG. 18B 136-2

| LIBRARY ID | 1 |
|---|---|
| INSTANCE ID | 1 |
| INPUT NET POTENTIAL ID | 1 |
| OUTPUT NET POTENTIAL ID | 3 |

138-2

| LIBRARY ID | 2 |
|---|---|
| INSTANCE ID | 2 |
| INPUT NET POTENTIAL ID | 2 |
| OUTPUT NET POTENTIAL ID | 4 |

140-2

| LIBRARY ID | 3 |
|---|---|
| INSTANCE ID | 3 |
| INPUT NET POTENTIAL ID | 3 |
| OUTPUT NET POTENTIAL ID | 4 |
| OUTPUT NET POTENTIAL ID | 5 |

FIG. 19A

| 142-1 | |
|---|---|
| LIBRARY ID | 3 |
| INSTANCE ID | 4 |
| INPUT NET POTENTIAL ID | 3 |
| INPUT NET POTENTIAL ID | 4 |
| OUTPUT NET POTENTIAL ID | 5 |

| 144-1 | |
|---|---|
| LIBRARY ID | 4 |
| INSTANCE ID | 5 |
| INPUT NET POTENTIAL ID | 5 |
| OUTPUT NET POTENTIAL ID | 7 |

| 146-1 | |
|---|---|
| LIBRARY ID | 5 |
| INSTANCE ID | 6 |
| INPUT NET POTENTIAL ID | 6 |
| OUTPUT NET POTENTIAL ID | (8) |

FIG. 19B

DELETED

| 144-2 | |
|---|---|
| LIBRARY ID | 4 |
| INSTANCE ID | 5 |
| INPUT NET POTENTIAL ID | 5 |
| OUTPUT NET POTENTIAL ID | 7 |

| 146-2 | |
|---|---|
| LIBRARY ID | 5 |
| INSTANCE ID | 6 |
| INPUT NET POTENTIAL ID | 6 |
| OUTPUT NET POTENTIAL ID | (7) |

FIG. 20A 148-1

| LIBRARY ID | 1 |
|---|---|
| LIBRARY NAME | LIB 1 |
| FAN-IN NUMBER | 1 |
| FAN-OUT NUMBER | 1 |

150-1

| LIBRARY ID | 2 |
|---|---|
| LIBRARY NAME | LIB 2 |
| FAN-IN NUMBER | 1 |
| FAN-OUT NUMBER | 1 |

152-1

| LIBRARY ID | 3 |
|---|---|
| LIBRARY NAME | LIB 3 |
| FAN-IN NUMBER | 2 |
| FAN-OUT NUMBER | 1 |

154-1

| LIBRARY ID | 4 |
|---|---|
| LIBRARY NAME | LIB 4 |
| FAN-IN NUMBER | 1 |
| FAN-OUT NUMBER | 1 |

156-1

| LIBRARY ID | 5 |
|---|---|
| LIBRARY NAME | LIB 5 |
| FAN-IN NUMBER | 1 |
| FAN-OUT NUMBER | 1 |

FIG. 20B 148-2

| LIBRARY ID | 1 |
|---|---|
| LIBRARY NAME | LIB 1 |
| FAN-IN NUMBER | 0 |
| FAN-OUT NUMBER | 1 |

150-2

| LIBRARY ID | 2 |
|---|---|
| LIBRARY NAME | LIB 2 |
| FAN-IN NUMBER | 2 |
| FAN-OUT NUMBER | 1 |

152-2

| LIBRARY ID | 3 |
|---|---|
| LIBRARY NAME | LIB 3 |
| FAN-IN NUMBER | 2 |
| FAN-OUT NUMBER | 1 |

154-2

| LIBRARY ID | 4 |
|---|---|
| LIBRARY NAME | LIB 4 |
| FAN-IN NUMBER | 1 |
| FAN-OUT NUMBER | 1 |

156-2

| LIBRARY ID | 5 |
|---|---|
| LIBRARY NAME | LIB 5 |
| FAN-IN NUMBER | 1 |
| FAN-OUT NUMBER | 1 |

FIG. 21A

| INSTANCE ID | 1 |
|---|---|
| IDENTICAL INSTANCE REPRESENTATIVE ID | 1 |
| INSTANCE NAME | blk 1 |

158-1

| INSTANCE ID | 2 |
|---|---|
| IDENTICAL INSTANCE REPRESENTATIVE ID | 2 |
| INSTANCE NAME | blk 2 |

160-1

| INSTANCE ID | 3 |
|---|---|
| IDENTICAL INSTANCE REPRESENTATIVE ID | 3 |
| INSTANCE NAME | blk 3 |

162-1

| INSTANCE ID | 4 |
|---|---|
| IDENTICAL INSTANCE REPRESENTATIVE ID | (4) |
| INSTANCE NAME | blk 4 |

| INSTANCE ID | 1 |
|---|---|
| IDENTICAL INSTANCE REPRESENTATIVE ID | 1 |
| INSTANCE NAME | blk 1 |

158-2

| INSTANCE ID | 2 |
|---|---|
| IDENTICAL INSTANCE REPRESENTATIVE ID | 2 |
| INSTANCE NAME | blk 2 |

160-2

| INSTANCE ID | 3 |
|---|---|
| IDENTICAL INSTANCE REPRESENTATIVE ID | 3 |
| INSTANCE NAME | blk 3 |

162-2

| INSTANCE ID | 4 |
|---|---|
| IDENTICAL INSTANCE REPRESENTATIVE ID | (3) |
| INSTANCE NAME | blk 4 |

| INSTANCE ID | 5 |
|---|---|
| IDENTICAL INSTANCE REPRESENTATIVE ID | 5 |
| INSTANCE NAME | blk 5 |

166-1

| INSTANCE ID | 6 |
|---|---|
| IDENTICAL INSTANCE REPRESENTATIVE ID | 6 |
| INSTANCE NAME | blk 6 |

| INSTANCE ID | 5 |
|---|---|
| IDENTICAL INSTANCE REPRESENTATIVE ID | 5 |
| INSTANCE NAME | blk 5 |

168-2

| INSTANCE ID | 6 |
|---|---|
| IDENTICAL INSTANCE REPRESENTATIVE ID | 6 |
| INSTANCE NAME | blk 6 |

FIG. 23A

| NET ID | 1 |
| --- | --- |
| IDENTICAL POTENTIAL NET REPRESENTATIVE ID | 1 |
| NET NAME | N 1 |

170-1

| NET ID | 2 |
| --- | --- |
| IDENTICAL POTENTIAL NET REPRESENTATIVE ID | 2 |
| NET NAME | N 2 |

172-1

| NET ID | 3 |
| --- | --- |
| IDENTICAL POTENTIAL NET REPRESENTATIVE ID | 3 |
| NET NAME | N 3 |

174-1

| NET ID | 4 |
| --- | --- |
| IDENTICAL POTENTIAL NET REPRESENTATIVE ID | 4 |
| NET NAME | N 4 |

| NET ID | 1 |
| --- | --- |
| IDENTICAL POTENTIAL NET REPRESENTATIVE ID | 1 |
| NET NAME | N 1 |

170-2

| NET ID | 2 |
| --- | --- |
| IDENTICAL POTENTIAL NET REPRESENTATIVE ID | 2 |
| NET NAME | N 2 |

172-2

| NET ID | 3 |
| --- | --- |
| IDENTICAL POTENTIAL NET REPRESENTATIVE ID | 3 |
| NET NAME | N 3 |

174-2

| NET ID | 4 |
| --- | --- |
| IDENTICAL POTENTIAL NET REPRESENTATIVE ID | 4 |
| NET NAME | N 4 |

176-2

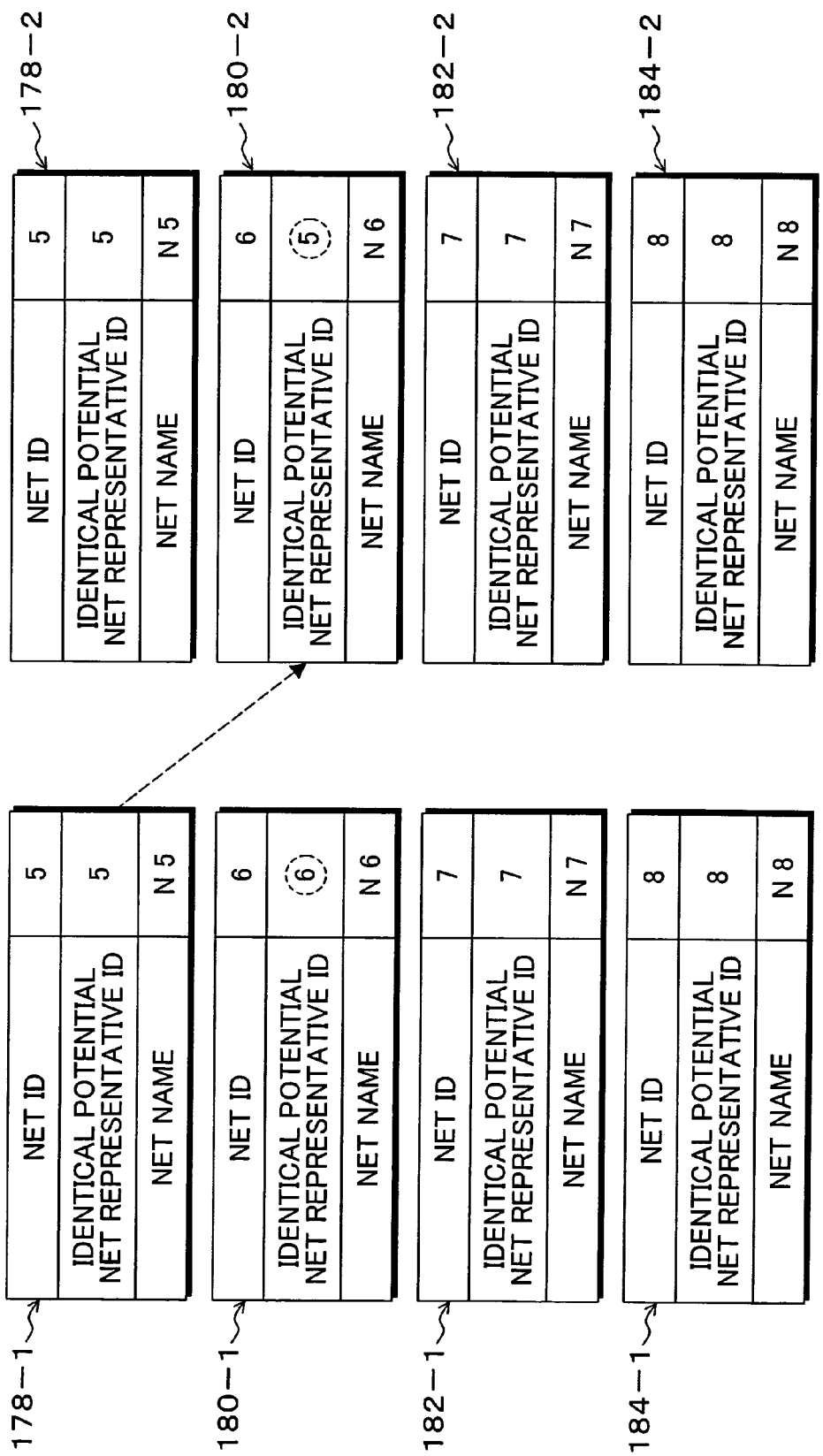

INTEGRATED CIRCUIT DESIGNING SYSTEM, METHOD AND PROGRAM

This application is a priority based on prior application No. JP 2004-180941, filed Jun. 18, 2004, in Japan.

BACKGROUND OF THE INVENTION

1. Field of the Invention

The present invention relates to an integrated circuit designing system, method and program for designing LSIs with the aid of a computer, and, more particularly, to an integrated circuit designing system, method and program for degenerating the size of simulation models for use in logic verification of the LSIs.

2. Description of the Related Art

Conventionally, in a computer-aided automated designing system of LSIs, design works are performed in conformity with design processes such as system design, function design, logic design, circuit design, layout design, design verification and mask data generation. Among these, function design includes designing a register transfer level (RT level) which determines the structure and operation inside a function block and using a logic simulator for verification of the design results. Logic design performed after the function design is gate level logic design and uses a logic simulator or timing simulator for checking of operations. To input and edit logic diagrams, a logic synthesis tool is used which automatically generates gate circuits from logic descriptions. Stated differently, in logic design, in order to compile logics described on the logic operation level into logics on the gate level and conduct a logic simulation on this gate level, logics described on the gate level are converted to basic primitives which can be executed by a simulator, to generate simulation models for simulations (see, e.g., Japanese Patent Application Laid-Open Publication Nos. 2000-358185 and 1996-87532).

However, there is a problem that, in a hardware simulator (hardware accelerator) used for logic simulations on the gate level, maximum verification model size (number of gates) which can be processed is limited and large net lists can not be handled. Also, in software simulator, as the size of the verification model becomes larger, the simulation rate is deteriorated and a file size of the generated simulation model is increased. In order to solve this problem, buffer reduction can be considered, wherein, for example, successive buffers 204-1, 204-2, . . . 204-n provided between FF 200 and FF 202 of FIG. 1A are targeted and the buffers 204-2 to 204-n are deleted as shown in FIG. 1B. However, if the buffer reduction is performed, there are problems that delay stage counts is affected and that timings are varied in a delay simulator because of different delay stage counts. Therefore, it is needed to delete the number of gates in the simulation model on the gate level, without affecting the delay stage counts.

SUMMARY OF THE INVENTION

According to the present invention there is provided an integrated circuit designing system, method and program for reducing the size of a verification model for use in a simulation on the gate level. The present invention provides an integrated circuit designing system. The present invention is characterized in that in the integrated circuit designing system converting a logic circuit described on the logic operation level to a logic circuit on the gate level and generating a simulation model from the logic circuit on the gate level, the system comprises a primitive conversion unit to convert the logic circuit on the gate level to a basic primitive that is executable by a simulator; and a gate degeneracy unit to, for the basic primitives, determine and delete a gate which can be deleted and which will not affect the delay stage count.

The gate degeneracy unit includes a constant gate degeneracy unit, a buffer degeneracy unit and an identical fan-in gate degeneracy unit. The constant gate degeneracy unit, for the basic primitives, determines a plurality of constant gates which have identical input/output conditions, deletes the constant gates except any one of the constant gates and branch connects the output of the remaining constant gate to destinations at the deleted constant gates in common. The buffer degeneracy unit, for the basic primitives, determines and deletes a fan-out-free buffer and a buffer which is serially connected to the input of the fan-out-free buffer. The identical fan-in gate degeneracy unit, for the basic primitives, determines a plurality of gates which have identical input/output conditions and identical fan-ins, deletes the gates except any one of the gates and branch connects the output of the remaining gate to destinations of the deleted gates. The constant gate degeneracy unit separately degenerates constant gates which output 0, 1, fanpedance Z or don't care X as a constant output logic value. The primitive conversion unit, when converting the logic circuit on the gate level to the basic primitives, generates for each gate a primitive table which defines linking relationships with each of a gate name, a library table which defines the number of fan-ins and fan-outs, an instance table which defines hierarchical relationships of the gates and an instance name and a net table which defines hierarchical relationships of the nets and an net name. The primitive table registers a library identifier, an instance identifier, an input net potential identifier and an output net potential identifier; the library table registers a library identifier, a gate type name, a fan-in count and a fan-out count; the net table registers a net identifier, an identical potential net representative identifier which shows an upper layer and a net; and the instance table registers an instance identifier, an identical instance representative identifier which shows an upper layer and an instance name. More specifically, the constant gate degeneracy unit deletes the primitive table of a constant gate to be deleted and changes the output net identifier in the primitive table of a gate at the output side of the constant gate to be deleted to the output net identifier in the primitive table of a gate at the output side of the remaining constant gate, changes a hierarchical relationship of the instance table of the constant gate to be deleted to the same value as a hierarchical relationship of the instance table of the remaining constant gate; and changes a hierarchical relationship of the net table of the constant gate to be deleted to the value of a hierarchical relationship of the remaining constant gate. The buffer degeneracy unit deletes the primitive table of a buffer to be deleted; changes a hierarchical relationship of the instance table of the buffer to be deleted to the same value as a hierarchical relationship of the instance table of a gate located at the input of the buffer to be deleted; and changes a hierarchical relationship of the net table of the buffer to be deleted to the value of a hierarchical relationship of a gate located at the input of the buffer to be deleted. The identical fan-in gate degeneracy unit deletes the primitive table of a gate to be deleted and changes the output net identifier in the primitive table of a gate at the output side of the gate to be deleted to the output net identifier in the primitive table of a gate at the output side of the remaining gate; changes a hierarchical relationship of the instance table of the gate to be deleted to the same value as a hierarchical relationship of the instance table of the remaining gate; and changes a hierarchical relationship of the net table of the gate to be deleted to the value of a hierarchical relationship of a gate located at the input of the deleted buffer.

The present invention provides an integrated circuit designing method. The present invention is characterized in that in the integrated circuit designing method converting a logic circuit described on the logic operation level into a logic circuit on the gate level and generating a simulation model from the logic circuit on the gate level, the method comprises:

a primitive conversion step of converting the logic circuit on the gate level to a basic primitive which is executable by a simulator;

constant gate degeneracy step of, for the basic primitives, determining a plurality of constant gates which have identical input/output conditions, deleting the constant gates except any one of the constant gates and branch connecting the output of the remaining constant gate to destinations of the deleted constant gates in common;

a buffer degeneracy step of, for the basic primitives, determining and deleting a fan-out-free buffer and a buffer which is serially connected to the input side of the fan-out-free buffer; and an identical fan-in gate degeneracy step of, for the basic primitives, determining a plurality of gates which have identical input/output conditions and identical fan-ins, deleting the gates except any one of the gates and branch connecting the output of the remaining gate to destinations of the deleted gates.

The present invention provides a program for generating a simulation model from the gate level logic. The program of the present invention is characterized in that it is operable to drive a computer to execute:

a primitive conversion step of converting a logic circuit described on the logic operation level into a logic circuit on the gate level and converting the logic circuit on the gate level to a basic primitive which is executable by a simulator;

a constant gate degeneracy step of, for the basic primitives, determining a plurality of constant gates which have identical input/output conditions, deleting the constant gates except any one of the constant gates and branch connecting the output of the remaining constant gate to destinations of the deleted constant gates in common;

a buffer degeneracy step of, for the basic primitives, determining and deleting a fan-out-free buffer and a buffer which is serially connected to the input side of the fan-out-free buffer; and an identical fan-in gate degeneracy step of, for the basic primitives, determining a plurality of gates which have identical input/output conditions and identical fan-ins, deleting the gates except any one of the gates and branch connecting the output of the remaining gate to destinations at the deleted gates. Details of an integrated circuit designing method and program according to the present invention will be essentially the same as those of the integrated circuit designing system.

According to the present invention, when converting logics described on the gate level into basic primitives and generating a simulation model, the number of the gates at the time of simulation model generation are reduced by determining and deleting gates which can be deleted or shared and will not affect delay stage counts. In this way, if maximum number of gates is increased and if it is large verification model, the verification model can be handled by a hardware simulator with limitation to the number of gates.

Also, with the reduction of the number of gates, number of event occurrence times is reduced and a simulation time is shortened. Further, in a software simulator, a file size of a simulation model gets smaller and the amount of disk space used can be reduced.

The above and other objects, features and advantages of the present invention will become more apparent from the following detailed description with reference to the drawings.

BRIEF DESCRIPTION OF THE DRAWINGS

FIGS. 6A and 6B are explanatory views of primitive table before and after degeneracy in constant gate degeneracy process of FIGS. 4A and 4B;

FIGS. 7A and 7B are explanatory views of library table before and after degeneracy in constant gate degeneracy process of FIGS. 4A and 4B;

FIGS. 8A and 8B are explanatory views of instance table before and after degeneracy in constant gate degeneracy process of FIGS. 4A and 4B;

FIGS. 9A and 9B are explanatory views of net table before and after degeneracy in constant gate degeneracy process of FIGS. 4A and 4B;

FIGS. 12A and 12B are explanatory views of primitive table before and after degeneracy in fan-out-free buffer degeneracy process of FIGS. 11A and 11B;

FIGS. 13A and 13B are explanatory views of library table before and after degeneracy in fan-out-free buffer degeneracy process of FIGS. 11A and 11B;

FIGS. 14A and 14B are explanatory views of instance table before and after degeneracy in fan-out-free buffer degeneracy process of FIGS. 11A and 11B;

FIGS. 15A and 15B are explanatory views of net table before and after degeneracy in fan-out-free buffer degeneracy process of FIGS. 11A and 11B;

FIG. 16 is a flowchart of fan-out-free buffer degeneracy process of the present invention;

FIGS. 17A and 17B are explanatory views before and after degeneracy in degeneracy process of identical fan-in gate of the present invention;

FIGS. 18A and 18B are explanatory views of primitive table before and after degeneracy in identical fan-in gate degeneracy process of FIGS. 17A and 17B;

FIGS. 19A and 19B are explanatory views of primitive table before and after degeneracy in identical fan-in gate degeneracy process of FIGS. 17A and 17B;

FIGS. 20A and 20B are explanatory views of library table before and after degeneracy in identical fan-in gate degeneracy process of FIGS. 17A and 17B;

FIGS. 21A and 21B are explanatory views of instance table before and after degeneracy in identical fan-in gate degeneracy process of FIGS. 17A and 17B;

FIGS. 22A and 22B are explanatory views of instance table before and after degeneracy in identical fan-in gate degeneracy process of FIGS. 17A and 17B;

FIGS. 23A and 23B are explanatory views of net table before and after degeneracy in identical fan-in gate degeneracy process of FIGS. 17A and 17B;

FIGS. 24A and 24B are explanatory views of net table before and after degeneracy in identical fan-in gate degeneracy process of FIGS. 17A and 17B.

DETAILED DESCRIPTION OF THE PREFERRED EMBODIMENTS

Figure 1A:
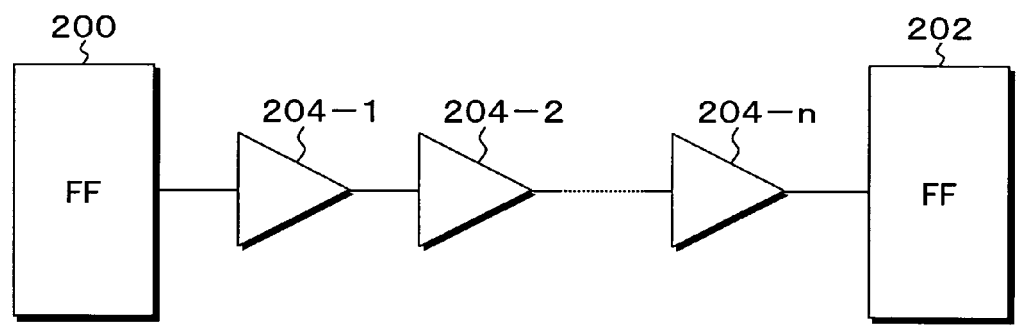
FIG. 1 is an explanatory view of conventional buffer degeneracy process in which delay stage count will be a problem.
Figure 1B:
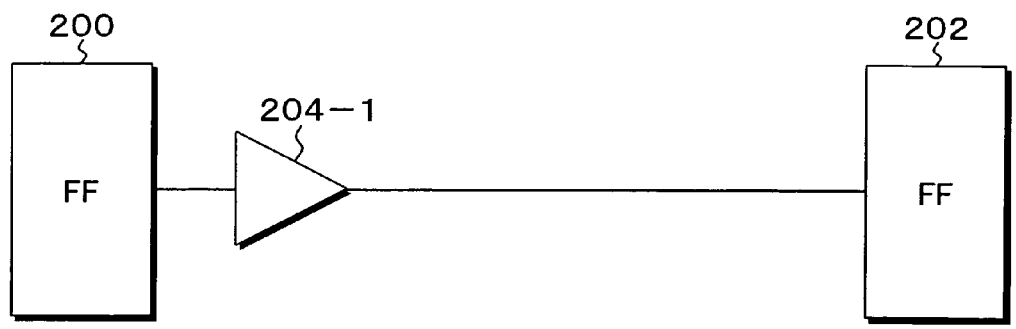
Figure 2:
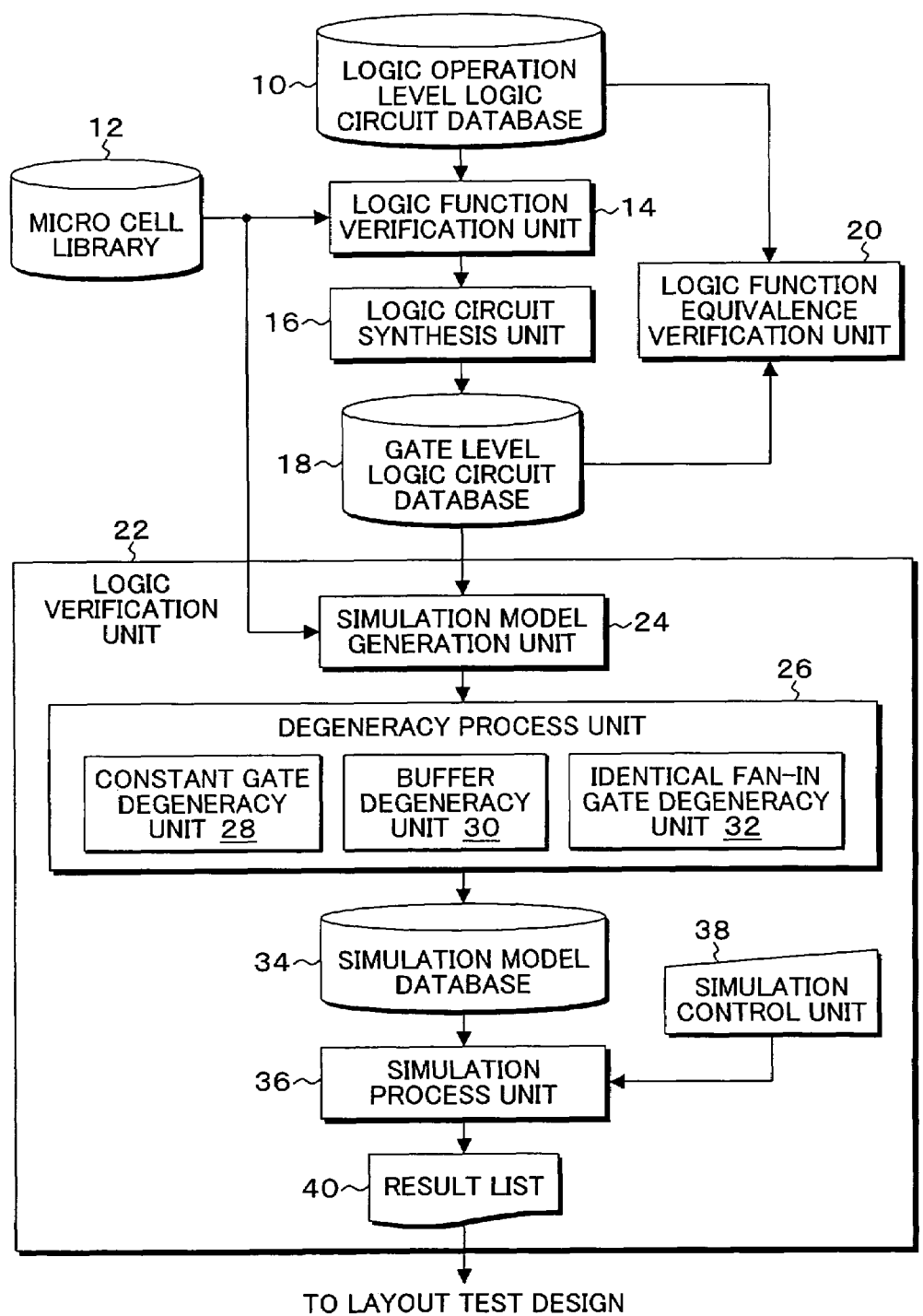
FIG. 2 is a block diagram of functional structure of circuit designing system according to the present invention.

FIG. 2 is a block diagram of function structures of function design and logic design in a integrated circuit designing system to which the present invention is applied. Normally, in process operations of computer-aided integrated circuit design, firstly as system design, what function blocks the entire system is divided into and how the blocks are operated are determined in order to achieve an intended system usage. Subsequently to this system design, function design is performed for designing a register transfer level (RT level) which determines structures and operations inside the function blocks, and subsequently to the function design, function design is performed for designing logic circuits on the gate level. FIG. 2 shows latter half of the function design in such semiconductor design operations and a subsequent portion of the logic design to which the present invention is applied. First, the latter half of the function design consists of a logic operation level logic circuit database 10 and a logic function verification unit 14, and the logic function verification unit 14 is provided with a micro cell library 12. In the logic operation level logic circuit database 10, logic circuits on the register transfer level generated by the function design is stored. For the logic circuits on the register transfer level in the logic operation level logic circuit database 10, verification of design results are performed by the logic function verification unit 14 which acts as a logic simulator. The logic design subsequent to the function design consists of a logic circuit synthesis unit 16, a gate level logic circuit database 18 and a logic verification unit 22. The logic circuit synthesis unit 16 compiles a logic circuit on the register transfer level stored in the logic operation level logic circuit database 10 into a logic circuit on the gate level and stores it into the gate level logic circuit database 18. In the logic circuit synthesis unit 16, a logic synthesis tool is used for automatically generating a gate circuit from the logic description in the logic operation level logic circuit database 10. A logic function equivalence verification unit 20 is further provided, equivalently converts the design results of the logic operation level logic circuit database 10 and the design results of the gate level logic circuit database 18 to verify logic functions and verifies whether a logic circuit on the logic operation level is correctly converted to a logic circuit on the gate level. The logic verification unit 22 acts as a logic simulator which performs checking of operations of the gate level logic circuit generated in the gate level logic circuit database 18. The logic verification unit 22 is provided with a simulation model generation unit 24, a degeneracy processing unit 26 according to the present invention, a simulation model database 34, a simulation processing unit 36, a simulation control unit (bench test) 38 and a result list 40. The result list of the logic verification unit 22 is output to a process operation of the next layout design. The simulation model generation unit 24 converts the gate level logic circuit stored in the gate level logic circuit database 18 to a basic primitive which can be processed with the simulation processing unit 36 and stores it into the simulation model database 34. In the present invention, when converting the gate level logic circuit to the basic primitive, the number of gates at the time of generation of the simulation model is reduced by determining the logic on the gate level, which can be deleted or shared and will not affect the delay stage count, in the degeneracy processing unit 26. The degeneracy processing unit 26 is provided with a constant gate degeneracy unit 28, a buffer degeneracy unit 30 and an identical fan-in gate degeneracy unit 32. The constant gate degeneracy unit 28 determines a plurality of constant gates which has identical input/output conditions, deletes the constant gates except any one of the constant gates and performs a degeneracy process in which the output of the remaining constant gate is branched and connected to destinations at the deleted constant gates in common. At this point, as the constant gates, there are constant gates which output 0, 1, fanpedance Z or don't care X as a constant output logic value and the degeneracy processes are performed for each constant gate separately. The buffer degeneracy unit 30 determines and deletes a fan-out-free buffers and a buffer which is serially connected to the input side of the buffer. Since the fan-out-free buffers is a buffer portion which was not deleted and left after the design is aborted in the middle of the function design and is unnecessary buffer, this is deleted at this stage. The identical fan-in gate degeneracy unit 32 determines a plurality of gates which has identical input/output conditions and identical fan-ins, deletes the gates except any one of the gates and performs a degeneracy process in which the output of the remaining constant gate is branched and connected to destinations at the deleted gates. Specific degeneracy processes of the constant gate degeneracy unit 28, the buffer degeneracy unit 30 and the identical fan-in gate degeneracy unit 32 provided in the degeneracy processing unit 26 are achieved by rewriting of data table structures in basic primitives for simulations which are converted from the gate level logic circuits. The table structure which constructs the basic primitive for the simulation consists of four (4) tables which are a primitive table, a library table, an instance table and a net table.

Figure 3A:
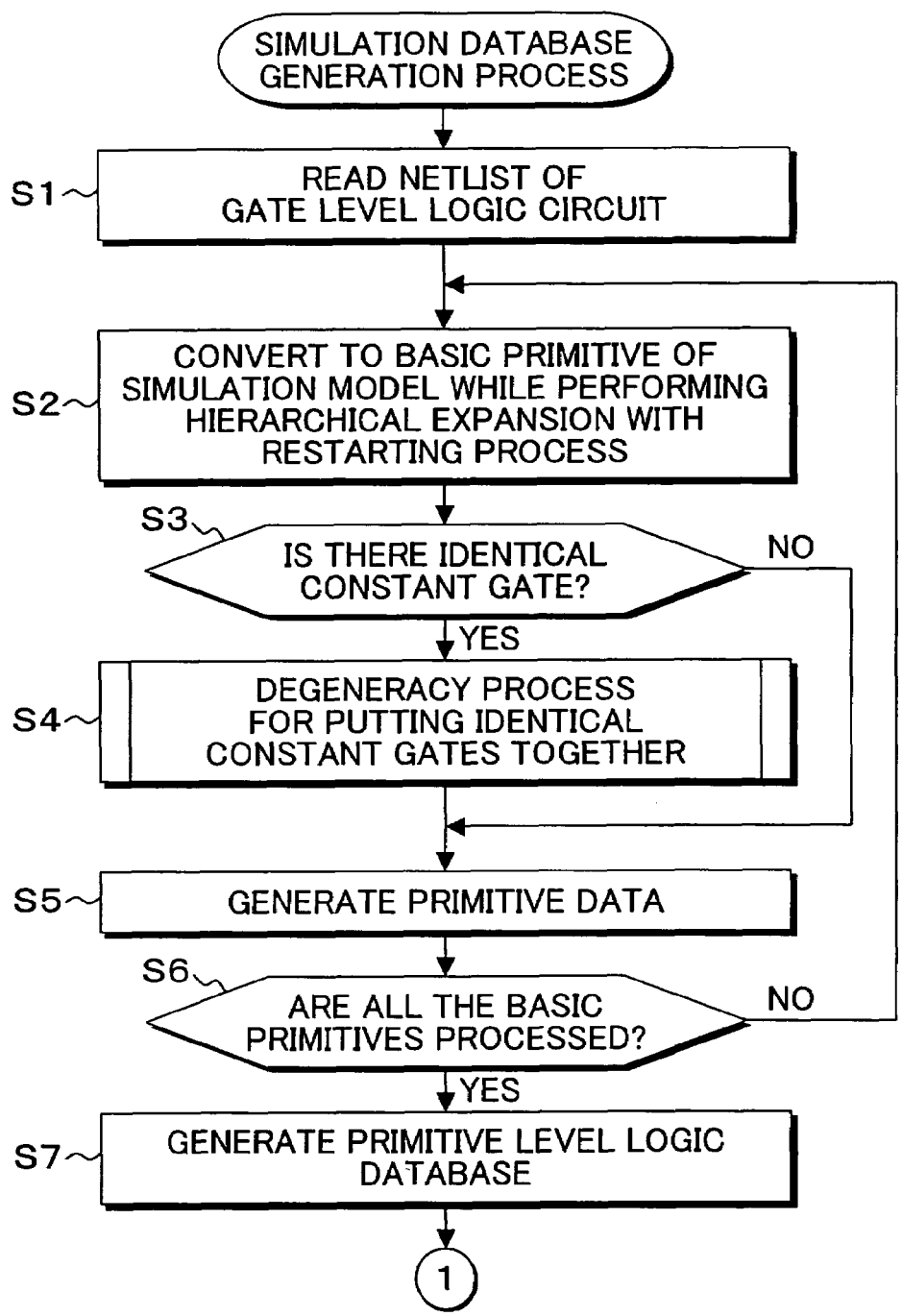
FIGS. 3A and 3B are flowcharts of simulation model database generation process by logic verification unit of FIG. 2.
Figure 3B:
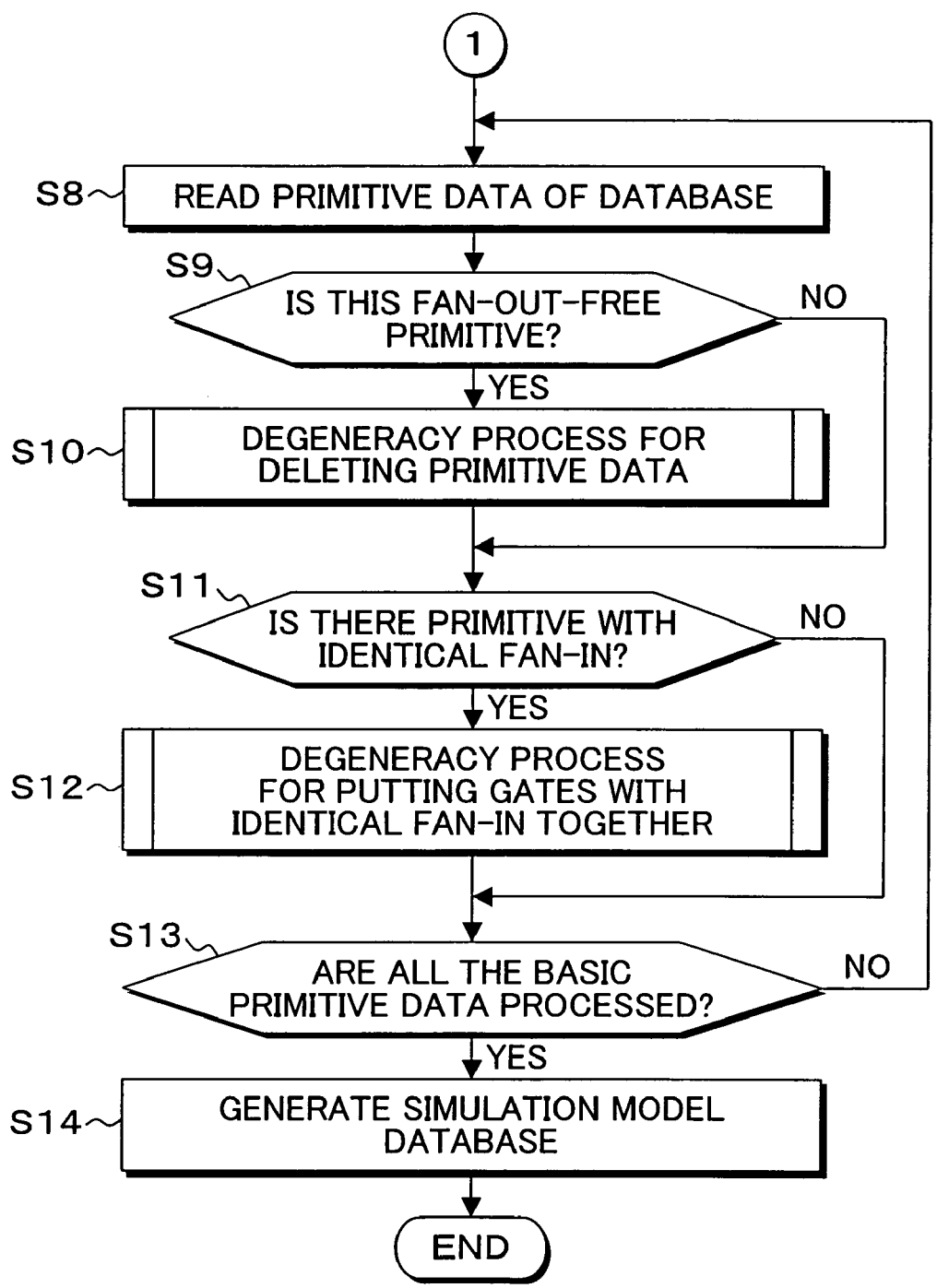

FIGS. 3A and 3B are flowcharts of a database generation process of a simulation model by the logic verification unit of FIG. 2. In FIGS. 3A and 3B, for the database generation process of the simulation model, a net list of the gate level logic circuit is read from the gate level logic circuit database 18 in step S1 and converted to a basic primitive of the simulation model while performing hierarchical expansion with a restarting process in step S2. At the time of this conversion to the basic primitive, if the constant gate is converted, it is checked whether other constant gate which has an identical input/output condition exits or not, and if it exists, a degeneracy process is performed for putting identical constant gates together. Then, in step S5, primitive data are generated. In step S6, it is checked whether conversion processes for all the basic primitives are completed or not, and if not completed, the procedure returns to step S2 and repeats the process, and if completed, a database of primitive level logic circuits is generated in step S7. Then, in step S8, the primitive data are read from the database and it is determined whether this is a primitive of a fan-out-free buffers or not. If this is the primitive of the fan-out-free buffers, in step S10, a degeneracy process is performed for deleting the primitive data of the buffer. Then, in step S11, when taking out a gate of a primitive with an identical fan-in, it is determined whether a gate exists or not as the primitive with an identical fan-in. If it exists, in step S12, a degeneracy process is performed for putting identical gates with the identical fan-ins together. Then, in step S11, it is checked whether processes for all the primitive data of the database are completed or not, and if the processes are not completed, the procedure returns to step S8 and repeats the process, and if the processes are completed, the procedure proceeds to step S14 and the simulation model database 34 of FIG. 2 is generated.

Figure 4A:
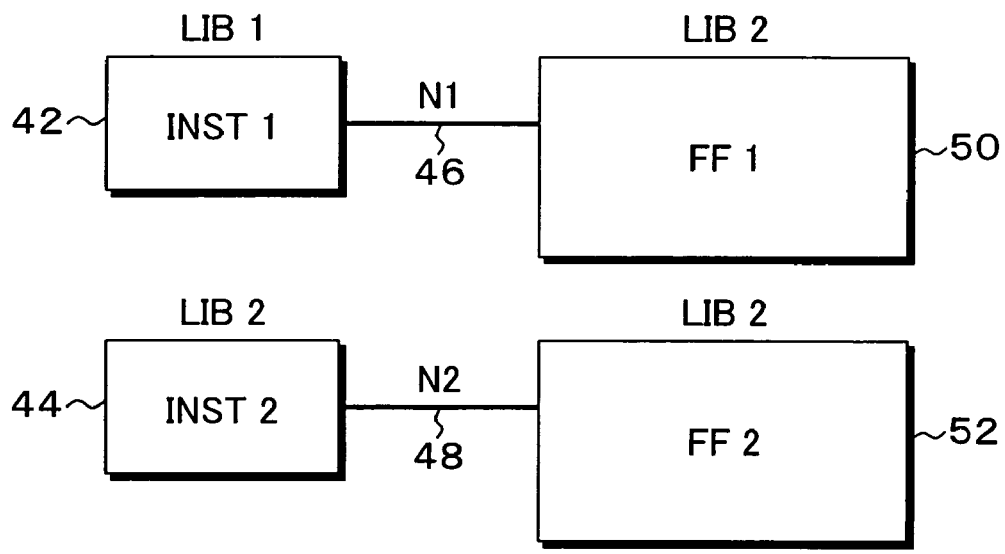
FIGS. 4A and 4B are explanatory views before and after degeneracy in degeneracy process of constant gate of the present invention.
Figure 4B:
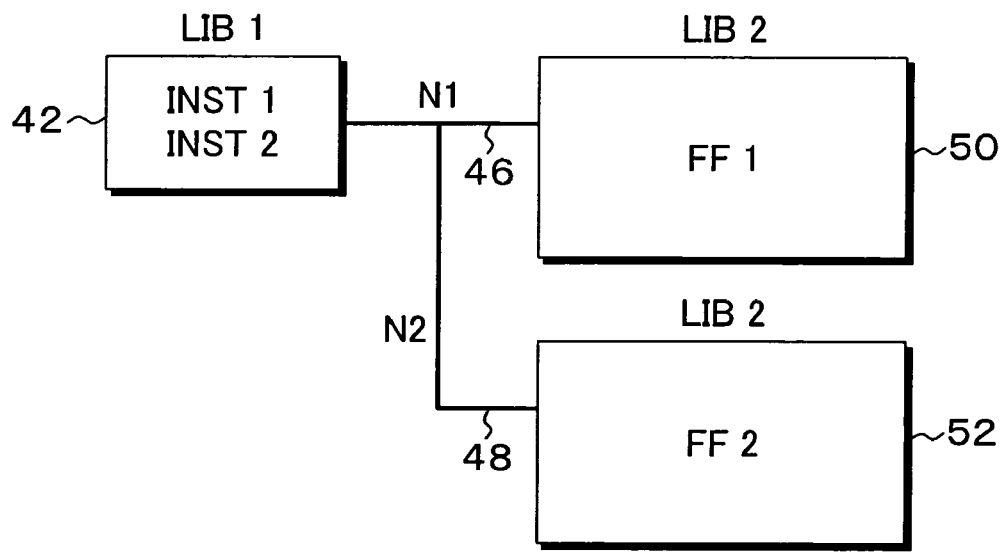

FIGS. 4A and 4B are explanatory views before and after degeneracy in the constant gate degeneracy process with the constant gate degeneracy unit 28 of FIG. 2. In FIG. 4A, which is a target gate circuit for the constant gate degeneracy process before degeneracy, constant gates 42 and 44 outputs 0 or 1 as the constant output and are connected to the inputs of FF gates 50 and 52 respectively. For the constant gate 42 and 44 and the FF gates 50 and 52 of FIGS. 4A and 4B which are targets of the constant gate degeneracy process, library names LIB1, LIB2, LIB2, LIB2 of the library table and instance names INST1, INST2, FF1, FF2 of the instance table are shown, and for nets 46 and 48, net names N1, N2 are shown. For the constant gates 42 and 44 of FIG. 4A, in the constant gate degeneracy process of the present invention, the constant gate 44 is deleted for leaving one (1) constant gate 42 as shown in FIG. 4B, and connection via the net 48 to the FF gate 52 on the output side of the deleted constant gate 44 is branched and connected from the net 46 of the remaining constant gate 42.

Figure 5A:
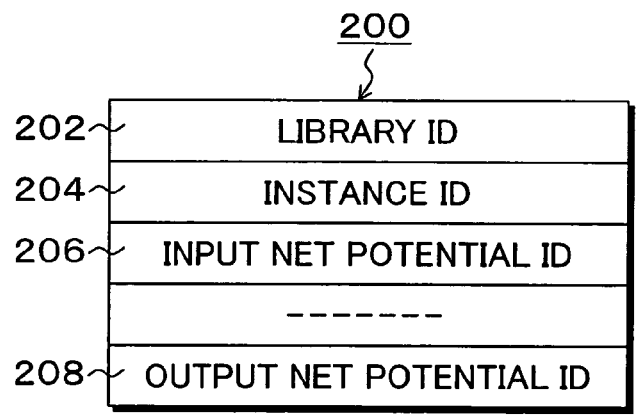
FIGS. 5A to 5D are explanatory views of table structure corresponding to basic primitive used in simulation of the present invention.
Figure 5B:
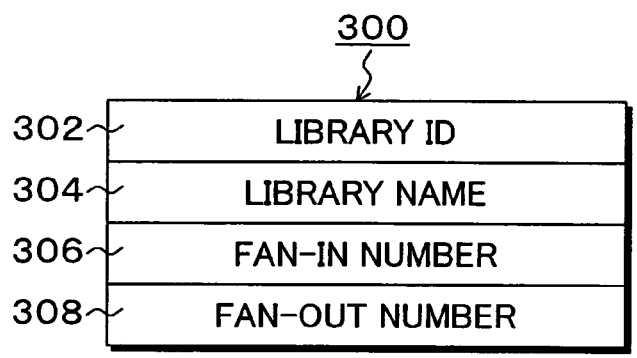
Figure 5C:
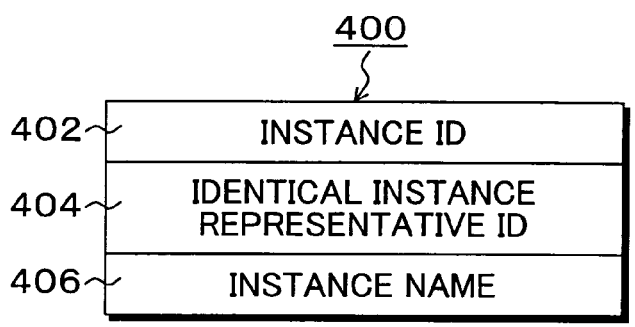
Figure 5D:
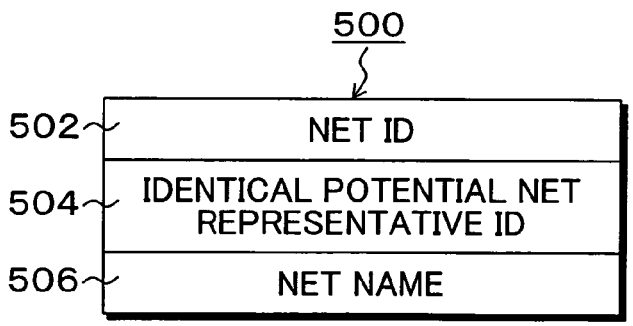

FIGS. 5A to 5D are explanatory views of table structures used for gate expression of a primitive level which is a target of the gate degeneracy process of the present invention. As shown in FIGS. 5A to 5D, gates of the primitive level consists of a primitive table 200, a library table 300, an instance table 400 and a net table 500. The primitive table 200 is provided with a library ID 202 as an identifier of the library table 300, an instance ID 204 as an identifier of the instance table 400, an input net potential ID 206 and an output net potential ID 208 as identifiers of the nets for input/output. The library table 300 of FIG. 5B, which is in a linking relationship with the primitive table 200 of FIG. 5A, consists of a library ID 302, a library name 304, a fan-in count 306 and fan-out count 308. The instance table 400 of FIG. 5C, which is in a linking relationship with the primitive table 200 of FIG. 5A, represents blocks of each gate of FIGS. 4A and 4B and consists of an instance ID 402, an identical instance representative ID 404 and an instance name 406. Among these, as the identical instance representative ID 404, an ID which shows an upper layer of a block which is specified by the instance table 400 is described. The net table 500 of FIG. 5D, which is in a linking relationship with the primitive table 200 of FIG. 5A, consists of a net ID 502, an identical potential net representative ID 504 and a net name 506. Among these, as the identical potential net representative ID 504, an ID which shows an upper layer of a net having the net table 500 is described.

FIGS. 6A and 6B are explanatory views of the primitive table before and after degeneracy in the constant gate degeneracy process of FIGS. 4A and 4B. FIG. 6A is a primitive table before degeneracy and is provided with a primitive table 54-1 corresponding to the constant gate 42 of FIG. 4A, a primitive table 56-1 corresponding to the constant gate 44, a primitive table 58-1 corresponding to the FF gate 50 and a primitive table 60-1 corresponding to the FF gate 52. These primitive tables 54-1, 56-1, 58-1 and 60-1 are represented by describing specific numeric values at the side of each item of the primitive table 200 shown in FIG. 5A. The linking relationships from the primitive tables 54-1 to 60-1 to the library tables and the instance tables of the constant gate 42 and 44 and FF gates 50 and 52 are shown by each ID. In the primitive tables before degeneracy 54-1 to 60-1 of FIG. 6A, by deleting the constant gate 44 as shown in FIG. 4B, the primitive table 56-1 corresponding to the deleted constant gate 44 is deleted as shown in FIG. 6B. Since, in response to the deletion of the constant gate 44, the net 48 is branched and connected to the net 46 from the remaining gate 42, the input net potential ID in the primitive table after degeneracy 60-2 of the FF gate 52 is rewritten from "2" which is before degeneracy to "1" which is the same as the output net potential ID in the primitive table 58-1 of the FF gate 50.

FIGS. 7A and 7B are explanatory views of the library table before and after degeneracy in the constant gate degeneracy process of FIGS. 4A and 4B. In a library table 62-1 with a library name "LIB 1" before degeneracy of FIG. 7A and a library with a library name "LIB 1", details are not changed and the same.

FIGS. 8A and 8B are explanatory views of the instance table before and after degeneracy in the constant gate degeneracy process of FIGS. 4A and 4B. The instance table before degeneracy of FIG. 8A is provided with an instance table 66-1 corresponding to the constant gate 42 before degeneracy of FIG. 4A, an instance table 68-1 corresponding to the constant gate 44, an instance table 70-1 corresponding to the FF gate 50 and an instance table 72-1 corresponding to the FF gate 52. When the degeneracy process deleting the constant gate 44 is performed as shown in FIG. 4B, the instance tables 66-1, 68-1, 70-1 and 72-1 before degeneracy will result in FIG. 8B. Among these, details of the tables of the constant gate 42 and the FF gates 50 and 52 other then the deleted constant gate 44 are the same as the details of the tables before degeneracy as shown in the instance tables 66-2, 70-2 and 72-2 of FIG. 7B, but in the instance table 68-2 of the deleted constant gate, the identical instance representative ID is changed from "2" which is before degeneracy to "1" which is after degeneracy. This changed identical instance representative ID "1" is the same as the value "1" of the identical instance representative ID in the instance table 66-2 of the remaining constant gate 42, and this puts the constant gate 42 into a shared status.

FIGS. 9A and 9B are explanatory views of the net table before and after degeneracy in the constant gate degeneracy process of FIGS. 4A and 4B. The net table before degeneracy of FIG. 9A consists of a net table 74-1 corresponding to the net 46 of FIG. 4A and a net table 76-1 corresponding to the net 48. For the nets 46 and 48, since the net 48 is branched and connected to the net 46 and put into a shared relationship after degeneracy as shown in FIG. 4B, a value of the identical net representative ID is changed from "2" which is before degeneracy to "1" which is after degeneracy following to the net table 46 of the net 48 after degeneracy of FIG. 9B and will be the same as the value "1" of the identical net representative ID in the net table 74-2 corresponding to the net 46.

Figure 10:
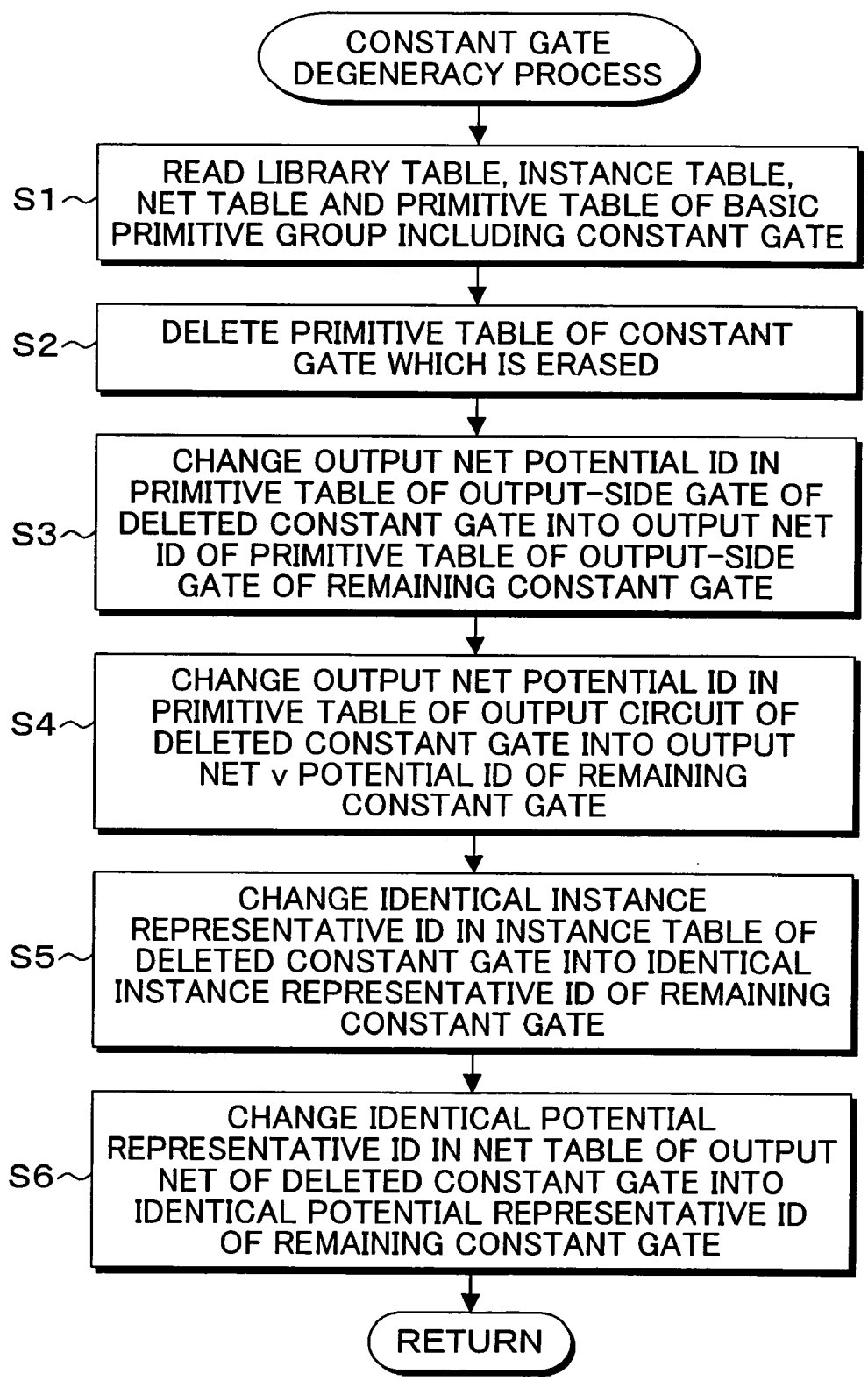
FIG. 10 is a flowchart of constant gate degeneracy process of the present invention.

FIG. 10 is a flowchart of the constant gate degeneracy process of the present invention. In FIG. 10, the library table, the instance table, the net table and the primitive table of the basic primitive group including the constant gate is read in step S1 and the primitive table of the constant table which is erased is deleted in step S2. Then, in step S3, the output net ID of the primitive table of the gate on the output side of the deleted gate is changed to the output net ID of the primitive table of the output side gate of the remaining gate. Then, in step S4, the output net potential ID of the primitive table which is an output circuit of the deleted constant gate is changed to the output potential ID of the remaining constant gate. Then, in step S5, the identical instance representative ID in the instance table of the deleted constant gate is changed to the identical instance representative ID of the remaining constant gate. Finally, in step S6, the identical potential representative ID in the net table of the output net of the deleted constant gate is changed to the identical potential representative ID of the remaining constant gate.

Figure 11A:
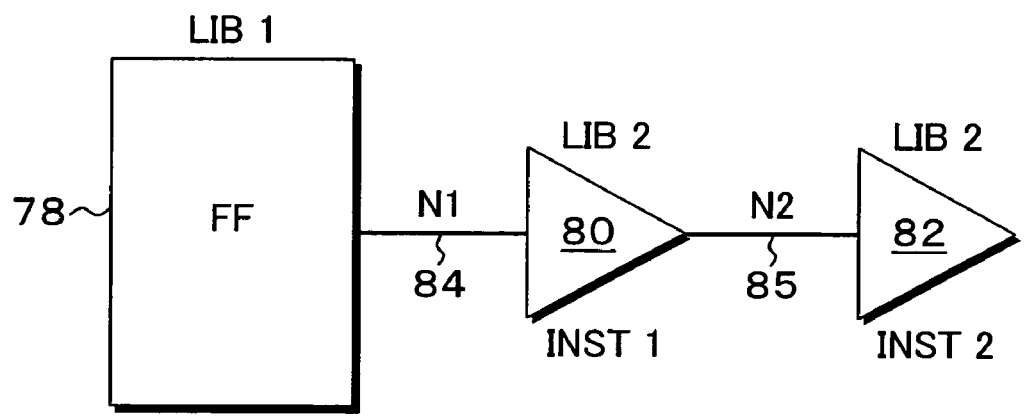
FIGS. 11A and 11B are explanatory views before and after degeneracy in degeneracy process of fan-out-free buffer of the present invention.

FIGS. 12A and 12B are explanatory views before and after degeneracy in the degeneracy process of a fan-out-free buffers according to the present invention. In FIG. 11A, which is a target circuit including the fan-out-free buffers before degeneracy, an output of FF gate 78 is connected with a buffer 80 via a net 84 and further connected with a buffer 82 via a net 85. The buffer 82 is a buffer which does not have fan-outs and the circuit design is aborted here. The presence of the buffer 82 which does not have fan-outs shows a case that, although buffers are provided on the output side of the gate 78 at the stage of the function design, these buffers are unnecessarily left because of revision of the design or the like. For the target circuit including the fan-out-free buffer 82 of FIG. 11A, the fan-out-free buffer 82 and the buffer 80 existing on the input side thereof are each deleted to share the nets 84 and 85.

Figure 11B:
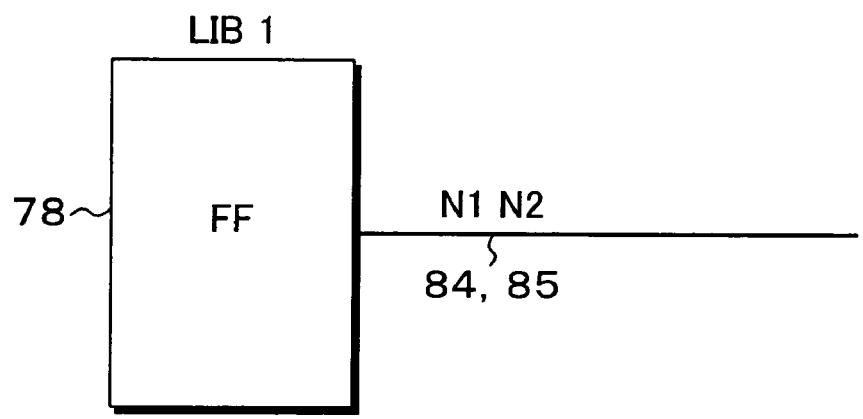

FIGS. 12A and 12B are explanatory views of the primitive table before and after degeneracy in the fan-out-free buffers degeneracy process of FIGS. 11A and 11B. In FIG. 12A, before degeneracy, a primitive table 86-1 is provided corresponding to the FF gate 78 of FIG. 11A; a primitive table 88-1 is provided corresponding to the buffer 80; and a primitive table 90-1 is provided corresponding to the buffer 82. In the primitive tables 86-1, 88-1, and 90-1 before degeneracy, by deleting the buffers 80, 82, the primitive tables 88-1, 90-1 are deleted in the table of FIG. 12B after degeneracy and a primitive table 86-2 corresponding to the FF gate 78 is left.

FIGS. 13A and 13B are explanatory views of the library table before and after degeneracy in the fan-out-free buffers degeneracy process of FIGS. 11A and 11B. Library tables 92-1 and 92-2 corresponding to the library names LIB1 and LIB 2 of FIG. 13A will be library tables 92-2 and 94-2 without change as shown in FIG. 13B.

FIGS. 14A and 14B are explanatory views of the instance table before and after degeneracy in the fan-out-free buffers degeneracy process of FIGS. 11A and 11B. Instance tables 96-1, 98-1 and 100-1 before degeneracy of FIG. 14A are provided corresponding to the FF gate 78, the buffer 80, and the buffer 82 of FIG. 11A. After degeneracy, since the buffers 80 and 82 are deleted as shown in FIG. 11B, for the instance tables 98-2 and 100-2 corresponding to the deleted buffers 80 and 82 out of instance tables 96-2, 98-2 and 100-2 after degeneracy of FIG. 14B, identical instance representative IDs before degeneracy, "2" and "3", are respectively changed to "1" which is the same as the identical instance representative ID in the instance table 96-2 of the remaining FF gate 78.

FIGS. 15A and 15B are explanatory views of the net table before and after degeneracy in the fan-out-free buffers degeneracy process of FIGS. 11A and 11B. Net tables 102-1 and 104-1 before degeneracy of FIG. 15A are provided corresponding to the nets 84 and 85 of FIG. 11A. Since, when the buffer 80 and 82 are deleted and degenerated as shown in FIG. 11B, the nets 84 and 85 are shared as one, the identical potential net representative ID in a net table 101-2 corresponding to the net 85 of FIG. 15B is changed from "2" which is before degeneracy to "1" which is the same as the identical potential net representative ID in the net table 102-2 of the net 84 after degeneracy.

FIG. 16 is a flowchart of the fan-out-free buffers degeneracy process of the present invention. In FIG. 16, the library table, the instance table, the net table and the primitive table of the target primitive group are read in step S1 and the primitive tables of the fan-out-free buffers and buffer with fan-outs and fan-ins which are one (1) provided on the input side thereof are deleted in step S2. The fan-ins and fan-outs of the buffer can be determined by referring to the library tables 92-1 and 92-2 shown in FIGS. 13A and 13B. Then, in step S3, the identical potential net representative ID in the instance table of the deleted buffer is changed to the identical potential net representative ID of the remaining circuit. Further, in step S4, the identical potential representative net IDs for the remaining two (2) net tables after the buffer deletion are standardized by changing one of the values to the other.

FIGS. 17A and 17B are explanatory views before and after degeneracy in an identical fan-in gate degeneracy process according to the present invention. In a target circuit unit before degeneracy of FIG. 17A, inputs of gates 108 and 110 are connected with nets 120 and 122 and outputs thereof on the nets 124 and 126 side are provided with gates 112 and 114. The gates 112 and 114 have inputs A and B which respectively input the outputs from the gates 108 and 110 via the nets 124 and 126 in common to constitute an identical fan-in gate. Outputs from the gate 112 and 114 are connected to gates 116 and 118 via nets 128 and 130 and outputs from the gates 116 and 118 are output via nets 132 and 134. For the target circuit of FIG. 10A, since the gates 112 and 114 are gates which have the identical fan-in gate, the gate 114 is deleted and the gate 112 is left as shown in FIG. 17B for standardization. To the inputs A and B of the remaining gate 112, the outputs of the gates 108 and 110 are connected via the nets 124 and 126. The input of the gate 112 are branched and connected to the gate 116 and 118 by standardization of the net 128 and 130.

FIGS. 18A, 18B, 19A and 19B are explanatory views of the primitive table before and after degeneracy in the identical fan-in gate degeneracy process of FIGS. 17A and 17B. Primitive tables 136-1, 138-1, 140-1, 132-1, 144-1 and 146-1 before degeneracy of FIGS. 18A and 19A are provided corresponding to the gates 108, 110, 112, 114, 116 and 118 of FIG. 17A, respectively. In the case that a degeneracy process in which the gate 114 which is an identical fan-in gate are deleted and standardized by the remaining gate 112 is performed, as shown in FIGS. 18B and 19B which is after degeneracy, the primitive table 142-1 corresponding to the deleted gate 114 is deleted, and for the primitive table 146-2 after degeneracy of the gate 118 which is connected with the net 130 of the output of the deleted gate, the output net potential ID is changed from "8" which is before degeneracy to "7" which is the same as the value of the output net potential ID in the primitive table 144-2 of the gate 116 to which the input is standardized after degeneracy for standardization.

FIGS. 20A and 20B are explanatory views of the library table before and after degeneracy in the identical fan-in gate degeneracy process of FIGS. 17A and 17B; library tables 148-1, 150-1, 152-1, 154-1 and 156-1 of FIG. 20A are provided corresponding to the gate 108, 110, 112, 114, 116 and 118 of FIG. 7A, respectively; and library tables 148-2, 150-2, 152-2, 154-2 and 156-2 has entry details same as the details before degeneracy.

FIGS. 21A, 21B, 22A and 22B are explanatory views of the instance table before and after degeneracy in the identical fan-in gate degeneracy process of FIGS. 17A and 17B. Instance tables 158-1, 160-1, 162-1, 164-1, 166-1 and 168-1 of FIG. 21A and 22A are provided corresponding to the gates 108, 110, 112, 114, 116 and 118 of FIG. 7A, respectively. For the instance tables before degeneracy, since the gate 114 is deleted by the degeneracy process shown in FIG. 17B, the value of the identical instance representative ID in the instance table 164-2 of FIG. 21B after degeneracy corresponding to the deleted gate 114 is changed from "4" which is before degeneracy to "3" which is the same as the value of the identical instance representative ID in the instance table 162-2 of the remaining gate 112 after degeneracy.

FIGS. 23A, 23B, 24A and 24B are explanatory views of the net table before and after degeneracy in the identical fan-in gate degeneracy process of FIGS. 17A and 17B. Net tables 170-1, 172-1, 174-1, 176-1, 178-1, 180-1, 182-1 and 184-1 of FIG. 23A and 24A are provided corresponding to the nets 120, 122, 124, 126, 128, 130, 132 and 134 before degeneracy of FIG. 17A, respectively. As shown in FIG. 17B, in the net tables of FIG. 11B after deleting the gate 114 and being degenerated, the identical potential net representative ID in the net table 180-2 corresponding to the net 130 of the output of the deleted gate 114 is changed from "6" which is before degeneracy to "5" which is the same as the value of the identical potential net representative ID of the net table 178-2 corresponding to the net 128 of the output of the remaining gate 112 after degeneracy.

Figure 25:
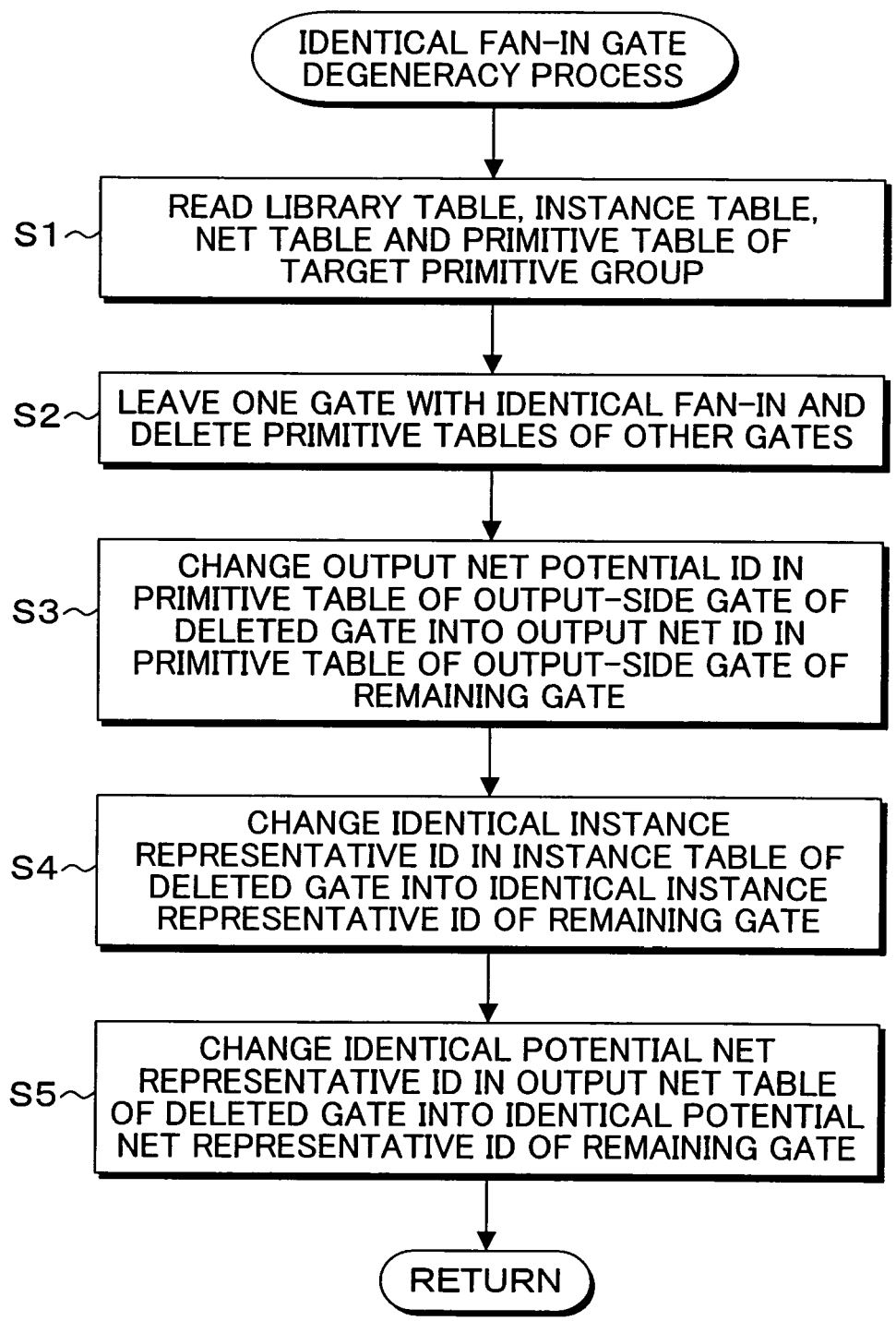
FIG. 25 is a flowchart of identical fan-in gate degeneracy process of the present invention.

FIG. 25 is a flowchart of the identical fan-in gate degeneracy process of the present invention. The library table, the instance table, the net table and the primitive table of the target primitive group are read in step S1 and the primitive table is deleted except one (1) gate of the identical fan-in in step S2. Then, in step S3, the output net potential ID in the primitive table of output-side gate of the deleted gate is changed to the output net ID in primitive table of output-side gate of remaining gate. Then, in step S4, the identical instance representative ID in the instance table of the deleted gate are changed to the identical instance representative ID of the remaining gate. Finally, in step S5, the identical potential net representative ID in the output net table of the deleted gate is changed to the identical potential net representative ID in the output net table of the remaining gate. Also, the present invention provides a program executed by a computer which constructs a semiconductor designing system and this program is achieved by a program which has process procedures of the flowcharts of the simulation model database generation process of FIGS. 3A and 3B, the constant gate degeneracy process of FIG. 10, the fan-out-free buffers deleting process of FIG. 16 and the identical fan-in gate degeneracy process of FIG. 25. Further, the order of changing details, associated with the degeneracy processes of the primitive table, the library table, the instance table and the net table constituting the basic primitives in the above embodiments, may be any order. Further, the present invention includes any alteration not impairing the purpose and the benefit thereof and is not limited by the numeric values shown in the above embodiments. While in the above embodiments, the case is taken as an example where three (3) processes, i.e., the constant gate degeneracy process, the fan-out-free buffers deleting process and the identical fan-in gate degeneracy process are performed as the degeneracy processes, performing at least any one of the degeneracy processes would have the effect of reducing the number of gates of the simulation model generated within that range.

What is claimed is:

1. An integrated circuit designing system converting a logic circuit described on the logic operation level to a logic circuit on a gate level and generating a simulation model from the logic circuit on the gate level, the system comprising:
   a primitive conversion unit to convert the logic circuit on the gate level to basic primitives executable by a simulator; and
   a gate degeneracy unit to, for the basic primitives, determine and delete a gate which, if deleted, will not affect a delay stage count.

2. The integrated circuit designing system of claim 1, wherein the gate degeneracy unit includes:
   a constant gate degeneracy unit to, for the basic primitives, determine a plurality of constant gates which have identical input/output conditions, delete all except for any one of the plurality of constant gates, which is a remaining constant gate, and branch connect output of the remaining constant gate to destination the plurality of deleted constant gates in common;
   a buffer degeneracy unit to, for the basic primitives, determine and delete a fan-out-free buffer and a buffer which is serially connected to input of the fan-out-free buffer; and
   an identical fan-in gate degeneracy unit to, for the basic primitives, determine a plurality of identical fan-in gates which have identical input/output conditions and identical fan-ins, delete all except for any one of the plurality of identical fan-in gates, which is a remaining identical fan-in gate, and branch connect output of the remaining identical fan-in gate to destinations of the plurality of deleted identical fan-in gates.

3. The integrated circuit designing system of claim 2, wherein the constant gate degeneracy unit separately degenerates constant gates which output 0, 1, fanpedance Z or don't care X as a constant output logic value.

4. The integrated circuit designing system of claim 2, wherein, when converting the logic circuit on the gate level to the basic primitives, the primitive conversion unit generates for each gate a primitive table which defines linking relationships with each of a gate name, a library table which defines the number of fan-ins and fan-outs, an instance table which defines hierarchical relationships of the gates and an instance name and a net table which defines hierarchical relationships of a net and an net name.

5. The integrated circuit designing system of claim 4, wherein
   the primitive table registers a library identifier, an instance identifier, an input net potential identifier and an output net potential identifier, wherein
   the library table registers a library identifier, a gate type name, a fan-in count and a fan-out count, wherein
   the net table registers a net identifier, an identical potential net representative identifier which shows an upper layer and the net, and wherein
   the instance table registers an instance identifier, an identical instance representative identifier which shows an upper layer and an instance name.

6. The integrated circuit designing system of claim 4, wherein the constant gate degeneracy unit:
   deletes the primitive table of a constant gate to be deleted and changes the output net identifier in the primitive table of a gate at the output side of the constant gate to be deleted to the output net identifier in the primitive table of a gate at the output side of the remaining constant gate;

changes a hierarchical relationship of the instance table of the constant gate to be deleted to the same value as a hierarchical relationship of the instance table of the remaining constant gate; and changes a hierarchical relationship of the net table of the constant gate to be deleted to the value of a hierarchical relationship of the remaining constant gate.

7. The integrated circuit designing system of claim 4, wherein the buffer degeneracy unit:

deletes the primitive table of a buffer to be deleted;

changes a hierarchical relationship of the instance table of the buffer to be deleted to the same value as a hierarchical relationship of the instance table of a gate located at the input of the buffer to be deleted; and changes a hierarchical relationship of the net table of the buffer to be deleted to the value of a hierarchical relationship of a gate located at the input of the buffer to be deleted.

8. The integrated circuit designing system of claim 4, wherein the identical fan-in gate degeneracy unit:

deletes the primitive table of a identical fan-in gate to be deleted and changes the output net identifier in the primitive table of a gate at the output side of the identical fan-in gate to be deleted to the output net identifier in the primitive table of a gate at the output side of the remaining identical fan-in gate;

changes a hierarchical relationship of the instance table of the identical fan-in gate to be deleted to the same value as a hierarchical relationship of the instance table of the remaining identical fan-in gate; and changes a hierarchical relationship of the net table of the identical fan-in gate to be deleted to the value of a hierarchical relationship of a gate located at the input of the deleted buffer.

9. An integrated circuit designing method converting a logic circuit described on the logic operation level into a logic circuit on the gate level and generating a simulation model from the logic circuit on the gate level, the method comprising:

converting the logic circuit on the gate level to basic primitives which is executable by a simulator;

degenerating a constant gate, for the basic primitives, by determining a plurality of constant gates which have identical input/output conditions, deleting all except for any one of the plurality of constant gates, which is a remaining constant gate, and branch connecting output of the remaining constant gate to destinations of the plurality of deleted constant gates in common;

degenerating a buffer, for the basic primitives, by determining and deleting a fan-out-free buffer and a buffer which is serially connected to input side of the fan-out-free buffer; and degenerating an identical fan-in gate for the basic primitives, by determining a plurality of identical fan-in gates which have identical input/output conditions and identical fan-ins, deleting all except for any one of the plurality of identical fan-in gates which is a remaining identical fan-in gate, and branch connecting output of the remaining identical fan-in gate to destinations of the plurality of deleted identical fan-in gates.

10. The integrated circuit designing method of claim 9, wherein the degenerating a constant gate includes:

separately degenerating constant gates which output 0, 1, fanpedance Z or don't care X as a constant output logic value.

11. The integrated circuit designing method of claim 9, wherein said converting further comprises:

when converting the logic circuit on the gate level into the basic primitives, generating for each gate a primitive table which defines linking relationships with each of a gate name, a library table which defines the number of fan-ins and fan-outs, an instance table which defines hierarchical relationships of the gates and an instance name and a net table which defines hierarchical relationships of a net and an net name.

12. The integrated circuit designing method of claim 11, wherein the primitive table registers a library identifier, an instance identifier, an input net potential identifier and an output net potential identifier, wherein the library table registers a library identifier, a gate type name, a fan-in count, a fan-out count, wherein the net table registers a net identifier, an identical potential net representative identifier which shows an upper layer and the net and wherein the instance table registers an instance identifier, an identical instance representative identifier which shows an upper layer and an instance name.

13. The integrated circuit designing method of claim 11, wherein the degenerating a constant gate includes:

deleting the primitive table of a constant gate to be deleted and changing the output net identifier in the primitive table of a gate at the output side of the constant gate to be deleted to the output net identifier in the primitive table of a gate at the output side of the remaining constant gate;

changing a hierarchical relationship of the instance table of the constant gate to be deleted to the same value as a hierarchical relationship of the instance table of the remaining constant gate; and changing a hierarchical relationship of the net table of the constant gate to be deleted to the value of a hierarchical relationship of the remaining constant gate.

14. The integrated circuit designing method of claim 11, wherein the degenerating a buffer includes:

deleting the primitive table of a buffer to be deleted;

changing a hierarchical relationship of the instance table of the buffer to be deleted to the same value as a hierarchical relationship of the instance table of a gate located at the input of the buffer to be deleted; and changing a hierarchical relationship of the net table of the buffer to be deleted to the value of a hierarchical relationship of a gate located at the input of the buffer to be deleted.

15. The integrated circuit designing method of claim 11, wherein the degenerating an identical fan-in gate includes:

deleting the primitive table of a identical fan-in gate to be deleted and changing the output net identifier in the primitive table of a gate at the output side of the identical fan-in gate to be deleted to the output net identifier in the primitive table of a gate at the output side of the remaining identical fan-in gate;

changing a hierarchical relationship of the instance table of the identical fan-in gate to be deleted to the same value as a hierarchical relationship of the instance table of the remaining identical fan-in gate; and changing a hierarchical relationship of the net table of the identical fan-in gate to be deleted to the value of a hierarchical relationship of a gate located at the input of the deleted buffer.

16. A computer-readable medium storing a program operable to drive a computer to execute:
converting a logic circuit described on the logic operation level into a logic circuit on the gate level and converting the logic circuit on the gate level to basic primitives which is executable by a simulator;
degenerating a constant gate, for the basic primitives, by determining a plurality of constant gates which have identical input/output conditions, deleting all except for any one of the plurality of constant gates, which is a remaining constant gate, and branch connecting output of the remaining constant gate destinations of the plurality of deleted constant gates in common;
degenerating a buffer, for the basic primitives, by determining and deleting a fan-out-free buffer and a buffer which is serially connected to an input side of the fan-out-free buffer; and
degenerating an identical fan-in gate, for the basic primitives, by determining a plurality of identical fan-in gates which have identical input/output conditions and identical fan-ins, deleting all except for any one of the plurality of identical fan-in gates which is a remaining identical fan-in gate, and branch connecting output of the remaining identical fan-in gate to destinations at the plurality of deleted identical fan-in gates.

17. The computer-readable medium of claim 16, wherein the degenerating a constant gate includes:
separately degenerating constant gates which output 0, 1, fanpedance Z or don't care X as a constant output logic value.

18. The computer-readable medium of claim 16 wherein the, converting further comprises:
when converting the logic circuit on the gate level into the basic primitives, generating for each gate a primitive table which defines linking relationships with each of a gate name, a library table which defines the number of fan-ins and fan-outs, an instance table which defines hierarchical relationships of the gates and an instance name and a net table which defines hierarchical relationships of a net and an net name.

19. The computer-readable medium claim 18, wherein the primitive table registers a library identifier, an instance identifier, an input net potential identifier and an output net potential identifier, wherein
the library table registers a library identifier, a gate type name, a fan-in count, a fan-out count, wherein the net table registers a net identifier, an identical potential net representative identifier which shows an upper layer and the net, and wherein
the instance table registers an instance identifier, an identical instance representative identifier which shows an upper layer and an instance name.

20. The computer-readable medium of claim 18, wherein the degenerating a constant gate includes:
deleting the primitive table of a constant gate to be deleted and changing the output net identifier in the primitive table of a gate at the output side of the constant gate to be deleted to the output net identifier in the primitive table of a gate at the output side of the remaining constant gate;
changing a hierarchical relationship of the instance table of the constant gate to be deleted to the same value as a hierarchical relationship of the instance table of the remaining constant gate; and
changing a hierarchical relationship of the net table of the constant gate to be deleted to the value of a hierarchical relationship of the remaining constant gate.

21. The computer-readable medium of claim 18, wherein the degenerating a buffer includes:
deleting the primitive table of a buffer to be deleted;
changing a hierarchical relationship of the instance table of the buffer to be deleted to the same value as a hierarchical relationship of the instance table of a gate located at the input of the buffer to be deleted; and
changing a hierarchical relationship of the net table of the buffer to be deleted to the value of a hierarchical relationship of a gate located at the input of the buffer to be deleted.

22. The computer-readable medium of claim 18, wherein the degenerating an identical fan-in gate includes:
deleting the primitive table of a identical fan-in gate to be deleted and changing the output net identifier in the primitive table of a gate at the output side of the identical fan-in gate to be deleted to the output net identifier in the primitive table of a gate at the output side of the remaining identical fan-in gate;
changing a hierarchical relationship of the instance table of the identical fan-in gate to be deleted to the same value as a hierarchical relationship of the instance table of the remaining identical fan-in gate; and changing a hierarchical relationship of the net table of the identical fan-in gate to be deleted to the value of a hierarchical relationship of a gate located at the input of the deleted buffer.

* * * * *

UNITED STATES PATENT AND TRADEMARK OFFICE
CERTIFICATE OF CORRECTION

PATENT NO.        : 7,260,791 B2
APPLICATION NO. : 10/972412
DATED             : August 21, 2007
INVENTOR(S)       : Tsuyoshi Mochizuki It is certified that error appears in the above-identified patent and that said Letters Patent is hereby corrected as shown below:

Column 12, Line 24, change "destination" to --destinations at--.

Column 13, Line 61, change "gates" to --gates,--.

Column 14, Line 23, change "net" to --net,--.

Column 15, Line 16, after "gate" insert --to--.

Column 15, Line 26, change "gates" to --gates,--.

Column 15, line 35, after "16" insert --,--.

Column 15, Line 36, change "the," to --the--.

Column 15, Line 45, after "medium" insert --of--.

Signed and Sealed this

Fifteenth Day of April, 2008

JON W. DUDAS
*Director of the United States Patent and Trademark Office*